US005216338A

United States Patent [19]

Wilson

[11] Patent Number: 5,216,338

[45] Date of Patent: Jun. 1, 1993

[54] CIRCUIT ARRANGEMENT FOR ACCURATELY AND EFFECTIVELY DRIVING AN ULTRASONIC TRANSDUCER

[75] Inventor: Robert F. Wilson, Vancouver, Canada

[73] Assignee: Firma J. Eberspacher, Esslingen, Fed. Rep. of Germany

[21] Appl. No.: 799,396

[22] Filed: Nov. 27, 1991

Related U.S. Application Data

[62] Division of Ser. No. 417,295, Oct. 5, 1989, Pat. No. 5,113,116.

[51] Int. Cl.[5] .......... H01L 41/08

[52] U.S. Cl. .......... 318/116; 310/316

[58] Field of Search .......... 310/316, 317, 319, 321, 310/323; 239/102.2; 318/116, 118

[56] References Cited

U.S. PATENT DOCUMENTS

| | | | |
|---|---|---|---|
| 3,158,928 | 12/1964 | De Prisco et al. | 310/316 X |
| 3,638,087 | 1/1972 | Ratcliff | 310/316 X |
| 3,819,961 | 6/1974 | Bourgeois et al. | 310/316 |
| 3,842,340 | 10/1974 | Blandquist | 310/316 X |
| 3,885,902 | 5/1975 | Fujieda et al. | 310/316 X |
| 3,975,650 | 8/1976 | Payne | 310/316 |
| 4,168,447 | 9/1979 | Bussiere et al. | 310/316 |
| 4,271,371 | 6/1981 | Furuichi et al. | 310/316 X |
| 4,275,363 | 6/1981 | Mishio et al. | 310/316 X |
| 4,277,710 | 7/1981 | Harwood et al. | 310/316 |
| 4,277,758 | 7/1981 | Mishiro | 310/316 X |
| 4,468,581 | 8/1984 | Okada et al. | 310/316 |
| 4,551,690 | 11/1985 | Quist | 310/316 X |
| 4,689,515 | 8/1987 | Benndorf et al. | 310/316 |
| 4,703,213 | 10/1987 | Gasler | 310/316 |
| 4,736,130 | 4/1988 | Puskas | 310/316 |
| 4,748,365 | 5/1988 | Poupaert et al. | 310/316 |
| 4,868,445 | 9/1989 | Wand | 310/316 |
| 4,868,521 | 9/1989 | Konrad | 310/316 X |
| 4,879,528 | 11/1989 | Gotanda | 310/316 X |
| 4,888,565 | 12/1989 | Littleford et al. | 310/316 X |
| 4,939,402 | 7/1990 | Hirayama et al. | 310/316 |
| 4,970,656 | 11/1990 | Lo et al. | 310/316 X |
| 4,973,876 | 11/1990 | Roberts | 310/316 |
| 5,113,116 | 5/1992 | Wilson | 310/316 |

FOREIGN PATENT DOCUMENTS

| | | |
|---|---|---|
| 0303944 | 2/1989 | European Pat. Off. . |
| 0340470 | 11/1989 | European Pat. Off. . |
| 3625149A1 | 2/1988 | Fed. Rep. of Germany . |
| 3625461A1 | 2/1988 | Fed. Rep. of Germany . |
| 415137 | 12/1966 | Switzerland . |

OTHER PUBLICATIONS

"Piezoelectric Ceramics" By J. van Randeraat and R. E. Setterington, 1974, Mullard, Ltd., pp. 159-168.

*Primary Examiner*—Mark O. Budd

*Attorney, Agent, or Firm*—Frishauf, Holtz, Goodman & Woodward

[57] ABSTRACT

A method for driving an ultrasonic transducer, intended for use in atomization of liquids, at one of its selected resonance frequencies, by tuning out the capacitance of the ultrasonic transducer by means of an inductor, by sensing the transducer current, by comparing the phases of the transducer driving voltage and the transducer current and by controlling a voltage controlled oscillator for driving the ultrasonic transducer, by means of a phase error signal such that the ultrasonic transducer is driven with a frequency at which the transducer driving voltage and the transducer current are in phase, whereby the transducer driving circuit is locked to a natural resonance frequency of the ultrasonic transducer.

4 Claims, 2 Drawing Sheets

CIRCUIT ARRANGEMENT FOR ACCURATELY AND EFFECTIVELY DRIVING AN ULTRASONIC TRANSDUCER

This is a division of application Ser. No. 07/417,295 filed Oct. 5, 1989, now U.S. Pat. No. 5,113,116, issued May 12, 1992.

BACKGROUND OF THE INVENTION

This invention relates to ultrasonic wave generators, and in particular to a circuit for driving an ultrasonic transducer used for atomizing fuel oil over an extended temperature range with improved efficiency.

Numerous circuits which can be used to drive an ultrasonic transducer at useful power levels with reasonable efficiency are known. These transducers are commonly made from a piezoelectric ceramic material which exhibits electro-mechanical resonance effects typical of many piezoelectric devices. When operated at one of the natural resonance frequencies, greatly improved electrical to mechanical power conversion can be accomplished when the resulting vibrations are amplified using a suitable horn.

There are two basic ways to detect resonance of a piezoelectric transducer. Assuming the most common situation of driving from a constant voltage source, the frequency can be varied until a relative maximum amplitude of driving current is found. This is the series resonance frequency. Alternatively, if parallel resonance is desired, a relative current minimum is searched for. A means of eliminating the influence of the nominal capacitance of the transducer is required when operating at series resonance, such as adding a tuning inductor, otherwise the amplitude peak will not occur exactly at the true resonance frequency. With this method, the phase relationship between the transducer voltage and current is ignored.

The second basic method is to ignore the signal amplitude, and search for a frequency where transducer voltage and current are in phase. Since this occurs both at series and parallel resonance, the very large difference in transducer current for these two resonance modes may easily be used to differentiate between them. As before with the amplitude method, a means of tuning out the nominal transducer capacitance is required, in this case to ensure that the transducer is purely resistive at reasonance, and therefore that current and voltage are in phase at this point. With this method, other than to use the very large difference in transducer current at series compared with parallel resonance, signal amplitude is of no interest.

Both methods have advantages and disadvantages. Many of the recent patents on ultrasonic generators use the amplitude method for resonance detection. Although the basic concept is simple, this method suffers the very serious disadvantage that there is no absolute amplitude value to use as a reference for comparison, since this affected by many factors such as operating power level, tolerances of the transducer and of the generator circuit, loading of the transducer, etc. A relative comparison must be made of the signal level at different frequencies, on a continuous basis in order to find and follow the frequency which produces the highest amplitude. Thus, most of the patents which disclose amplitude-searching circuits, describe various ways of making small continuous frequency changes and keeping track of which frequency produces the highest relative amplitude. The simplicity of this basic concept is therefore complicated considerably. This method also suffers the disadvantage of greater noise sensitivity since most electrical noise affects signal amplitude, not frequency (the same reason that FM radio is far less affected by noise than AM radio).

The phase comparison method, by comparison is unaffected by signal amplitude variations; when driven at resonance, voltage and current are in phase regardless of amplitude. Another very major advantage is that the frequency is not required to be continously changed in order to search for the correct point of operation; the voltage and current signals are always present, and therefore can be continously compared to produce an error signal used to drive the circuit to the correct operating frequency. A disadvantage of this method is that it is not possible to tell the difference between series and parallel resonance, which must be accomplished separately by, for example, detecting the very large difference in amplitude between series and parallel resonance as mentioned above. The major problem with this method is that it is technically more difficult and does not lend itself well to the use of digital design techniques which are becoming more commonly used.

A known application of ultrasonic waves is in the atomization of liquids, particularly fuel oil. Specifically, a piezoelectric transducer is constructed so that fuel is allowed to flow over the surface of its horn. When the transducer is excited at one of its natural resonance modes with sufficient amplitude, the film of fuel oil that covers the horn is propelled from the surface in the form of a fog of fine droplets. Such an ultrasonic transducer has applications as a means of atomizing the fuel in an oil burning furnace, replacing, for example, the commonly used high pressure spray nozzle.

A disadvantage that occurs from the above mentioned operation of an ultrasonic transducer in a resonance mode, is that the sharp "Q" values obtained produce an attendant narrow operating frequency band. Relatively small deviations from the natural resonance frequency of the transducer can cause a significant reduction in power output. It is therefore necessary for the ultrasonic generator to track the natural resonance frequency of the transducer, which may not only change over time, but because of small and unavoidable differences between transducers, the resonance frequency may differ significantly between different transducers of the same type. The cause for differences in resonance frequency between apparently identical transducers is mainly tolerance differences, both in the dimensions of the mechanical parts and in the dimensions and electrical properties of the piezoelectric components. The causes for the change in resonance frequency over time include the known temperature dependence and ageing effects of piezoelectric elements, and specifically with ultrasonic atomizers, the additional mass of the liquid being atomized which may vary depending on conditions and type of liquid, and buildup of contaminants on the transducer such as carbon deposits.

The above mentioned tolerance differences also cause deviations in the characteristic impedance or reactance of transducers. Thus, when driven with a constant driving voltage, or with a constant driving current, apparently identical transducers produce different levels of output power. Some means is needed to ensure that the power output of all transducers is approximately equal.

A further problem specific to ultrasonic atomizers is the possibility of flooding the transducer horn with excess liquid. When this occurs, atomization stops and the otherwise sharp "Q" of the transducer is reduced to a very low value due to the damping action of the liquid, making it difficult to detect any resonance effects of the transducer.

The nature of ultrasonic atomization creates another problem. There is required a minimum amplitude of vibration before sufficient energy is imparted to the liquid on the transducer to cause it to be propelled from the horn.

A major influence on this minimum amplitude or power level required is the viscosity of the liquid being atomized. Specifically with fuel oil, although the minimum power level required for atomization is very low at normal temperatures, this minimum power level increases dramatically at low temperatures, and is significantly affected by fuel oil quality and type. Therefore, at low temperature, impractically high levels of power may have to be used to achieve atomization, due in large part to the increasing viscosity of the fuel oil at low temperature.

OBJECT OF THE INVENTION

An object of this invention is to provide a circuit arrangement capable of resolving the above mentioned problems, specifically to provide a circuit arrangement which always drives an ultrasonic transducer exactly at its selected natural resonance frequency.

It is a further object of this invention to provide an improved method of finding then following the desired resonance frequency of an ultrasonic transducer.

It is a further object of this invention to provide a method of clearing excess liquid from a flooded ultrasonic transducer as a first step in operating the ultrasonic transducer at one of its resonance frequencies.

It is a further object of this invention to provide a means of automatic power control to compensate for variances in transducer impedance among different transducers.

It is still a further object of this invention to provide a means for reducing the minimum power level required to sustain atomization of a liquid by an ultrasonic transducer.

The invention, in one form thereof, provides a circuit arrangement for driving an ultrasonic transducer adapted to be used for atomization of liquids, at a selected one of its resonance frequencies, preferably one of its series resonance frequencies, by tuning out the nominal electrical capacitance of the transducer so that, when at resonance, the transducer driving voltage and the transducer current are in phase, comparing the phases of the transducer driving voltage and the transducer current by means of a phase comparator, and controlling a voltage controlled oscillator by a phase error output signal of the phase comparator via a low pass filter having a very high DC gain, where the output of the voltage controlled oscillator is used to drive the transducer.

Preferably, the output of the voltage controlled oscillator or VCO controls a power amplifier which drives an impedance matching driver transformer, the secondary winding of which is connected to the ultrasonic transducer.

In a preferred form of the invention, a current sensor for sensing the transducer current is connected to one input of the phase comparator by means of a threshold amplifier, the threshold of which is dimensioned such that it blocks low level signals occuring when the transducer is in parallel resonance.

In one form of the invention, the low pass filter coupled between the output of the phase comparator (also called phase detector in the following) and the input of the VCO comprises an integrating amplifier having a very high DC voltage gain, e.g. of about 100 dB.

In one form of the invention, the transducer is operated in a burst mode by interrupting the transducer driving voltage in dependency on the output signal of a pulse width modulator where the burst duty cycle is controlled to be dependent on the output level of the current sensor. In case of a small level output of the current sensor, the burst duty cycle is increased and in case of a high output level of the current sensor, the burst duty cycle is decreased.

In one form of the invention, there is provided a sweep generator preferably coupled to the input of the integrator amplifier, for providing the control input of the VCO with a sweeping signal if an auxiliary phase comparator comparing the phases of the transducer driving voltage and the transducer current, detects an out-of-phase condition. In that case, a switch disconnecting the sweep generator from the VCO if there is detected an in-phase condition, is closed so that the output signal of the sweep generator starts sweeping the VCO.

Preferably, the input signal to the low pass filter is disconnected concurrently to the connecting cf the sweep generator to the VCO.

In one form of the invention, the output signal of the sweep generator is applied to an input of the integrating amplifier of the low pass filter.

In one form of the invention, the output signal of the auxiliary phase comparator is coupled to a resettable time delay circuit by means of which the sweeping circuit is activated only if the out-of-phase condition lasts longer than the maximum time period between two subsequent bursts in order to avoid that the sweep mode is activated between any two subsequent bursts.

The above mentioned and other features and objects of the invention and the manner of attaining them will become more apparent and the invention itself will be better understood by reference to the following description of embodiments of the invention taken in conjunction with the accompanying drawings, wherein.

DESCRIPTION OF BASIC-TRANSDUCER DRIVER CIRCUIT

Figure 1:
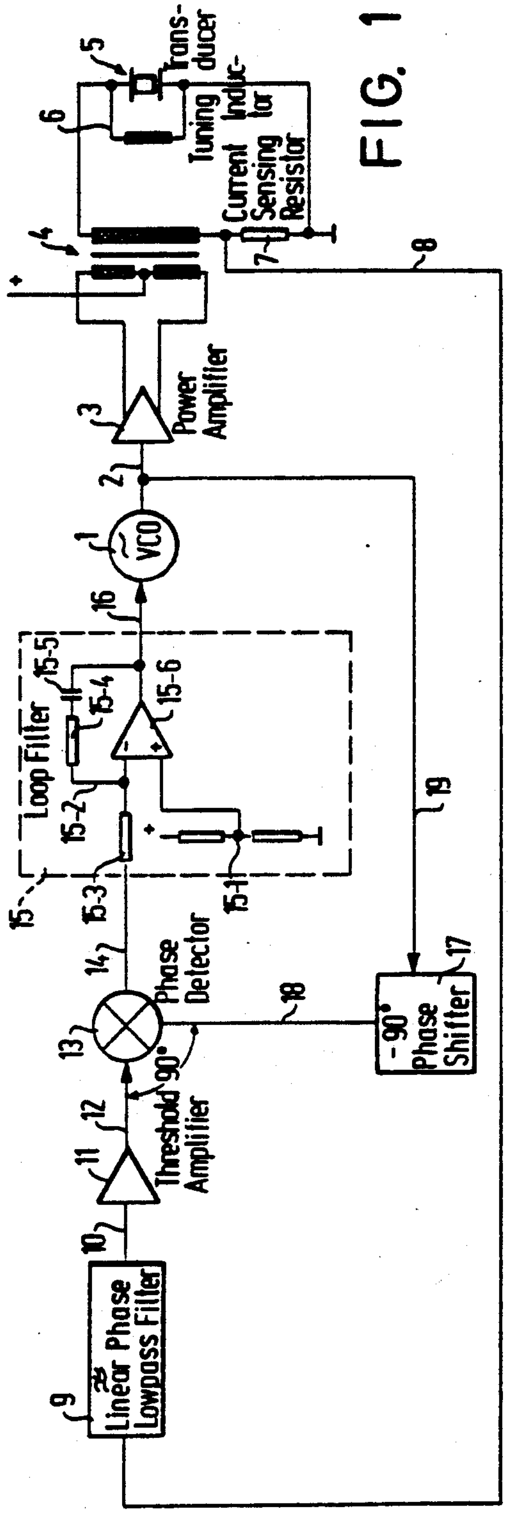
FIG. 1 is a circuit diagram of a first embodiment of the invention.

FIG. 1 shows a block diagram of a basic circuit which drives an ultrasonic transducer at its natural resonance frequency. In this circuit the transducer is driven at its fundamental series resonance frequency, however with minor circuit changes operation at parallel resonance is possible, as is operation at harmonics of the fundamental frequency.

The basic circuit consists of a voltage controlled oscillator 1, or VCO, power amplifier 3, impedance matching driver transformer 4, driven piezoelectric transducer 5, tuning inductor 6, current sensing resistor 7, lowpass filter 9 with linear phase response over the chosen VCO frequency range, threshold amplifier 11, phase detector 13, loop filter and high gain amplifier 15, and −90° phase shift network 17.

In the embodiment shown in FIG. 1, transducer 5 is parallely connected to the tuning inductor 6. The parallel connection of transducer 5 and inductor 6 is parallely connected to a series connection comprising a secondary winding of transformer 4 and the current sensing resistor 7. The connection point between the secondary winding and the current sensor resistor 7 is connected to the input of the linear phase lowpass filter 9, the output of which is connected to the threshold amplifier 11. The output of threshold amplifier 11 is connected to one input of the phase detector or comparator 13. The output 14 of phase comparator 13 is connected to the input of the loop filter and high gain amplifier 15, the output 16 of which is connected to the control input of VCO 1. The output 2 of VCO 1 is connected to a second input of the phase comparator 13 through a −90° phase shifter 17 on the one hand and to the input of the power amplifier 3 on the other hand. Two outputs of opposite phase of the power amplifier 3 are connected each to one end of a primary winding of transformer 4 in a push-pull configuration. A center tap of the primary winding is connected to a power supply source.

The loop filter and high gain amplifier 15 comprises an integrator including an operational amplifier 15-6, an inverting input of which is connected to the output 14 of phase comparator 13 through a resistor 15-3 and an non-inverting input of which is connected to a reference voltage source formed by means of a voltage divider comprising two resistors connected between the poles of a voltage supply source. The output of the operational amplifier 15-6 is connected to its inverting input through a series connection comprising a resistor 15-4 and a capacitor 15-5 on the one hand and to the control input of VCO 1 on the other hand.

Figure 2:
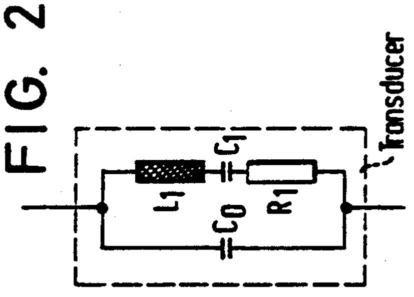
FIG. 2 is an equivalent circuit of a piezoelectric ultrasonic transducer.

To review some principles of operation of the piezoelectric transducer, FIG. 2 shows the equivalent circuit of the transducer. Co represents the actual capacitance of the transducer. L1, C1, and R1 are not actual components, but are electrical equivalents which accurately depict the operation of a piezoelectric transducer operating near its resonance frequency. It is customary to use L1 to symbolize the oscillating mass of the transducer, C1 to symbolize the elasticity, and R1 to symbolize the mechanical work.

Figure 3:
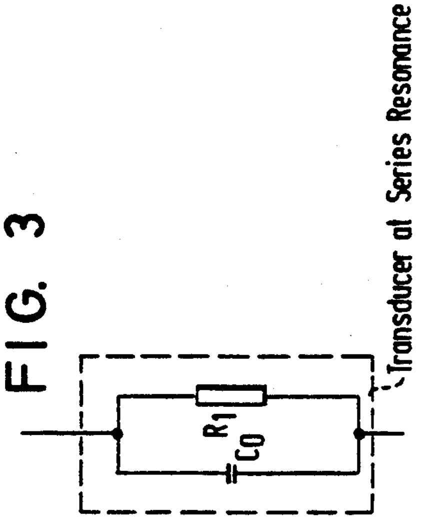
FIG. 3 is the equivalent circuit of the piezoelectric ultrasonic transducer at series resonance.

At series resonance, the reactance of L1 and C1 are equal in value, but opposite in sign, and therefore cancel. The result is the equivalent circuit shown in FIG. 3; at series resonance the transducer appears as a resistance R1 shunted by capacitance Co. Referring now to FIG. 1 if the transducer 5 is shunted by a tuning inductor 6, the value of which is selected to be parallel resonant with Co of the transducer at the series resonant frequency of the transducer, then the inductor 6 and Co together form a very high resistance, and can be ignored. Therefore, at series resonance, the transducer in parallel with the tuning inductor appears purely resistive to the driving seurce, equivalent to R1. Since the transducer (with tuning inductor) appears purely resistive, the current flowing through it is exactly in phase with the voltage driving it, at (and only at) its resonance point.

As a means of utilizing this known principle, FIG. 1 shows a basic circuit which uses a type of phase locked loop, with very high DC loop gain, to compare the phase of the transducer driving voltage with the phase of the resulting transducer current. The circuit acts in a way which automatically adjusts the frequency of the driving voltage to a point where the transducer voltage and current are in phase; that is, to the transducer resonance frequency. Because of the very high DC loop gain, the circuit is able to "lock" to the exact resonance point of any transducer, providing that its resonance frequency is within the selected operating range of the circuit; there is no phase error increase as the resonance frequency of the transducer approaches the limits of the circuit's selected operating range (as occurs with U.S. Pat. No. 4 275 363).

In more detail, the circuit operates as follows: the VCO 1 is adjusted to operate over a specific range of frequency that is wide enough to cover all possible deviations from the transducer's ideal series resonance frequency, caused by exposure of the transducer to temperature extremes, loading of the transducer with liquid to be atomized, deposits on the transducer, ageing of the transducer, and the effect of manufacturing tolerances. Since the VCO 1 can only operate within this range, operation at undesirable harmonic frequencies is not possible.

The output 2 of the VCO 2 is buffered and amplified by the output power amplifier 3 which drives the output transformer primary winding. In order to achieve minimum power loss in the power amplifier, the output transistors of the power amplifier operate as saturated switches, and a square wave output voltage results. The output transformer 4 increases the driving voltage to a suitable value for driving the transducer to the desired power level. The inductance of the transformer secondary is made to be much larger in value than the tuning inductance 6, so that the transformer secondary has no effect in tuning out the nominal capacitance Co of the transducer.

The output voltage at the transformer secondary is applied to the transducer 5 through the low resistance current sensing resistor 7. Since the nominal capacitance Co of the transducer is almost completely eliminated by the tuning inductor 6, without influence by the transformer secondary inductance, the current sensing resistor 7 is not affected by the high current that circulates between the tuning inductance and Co of the transducer. The current sensing resistor produces a signal 8 that is proportional to the current that flows through the so called "motional arm" of the transducer (that is, through L1, C1 and R1). At the series resonance frequency of the transducer, the current signal 8 is exactly in phase with the transducer driving voltage. Below series resonance, the phase of the current signal leads the phase of the driving voltage (the transducer appears capacitive). Just above series resonance, the current signal lags behind the driving voltage (the transducer appears inductive).

Since the driving voltage is a square wave, the resulting transducer current is rich in harmonics. Because an object of this circuit is to compare the phase of the transducer driving voltage with the resulting current, it is necessary to remove all harmonics from the current signal to prevent erratic circuit operation. The use of a standard type of lowpass filter to remove these harmonics would add a frequency dependent phase shift to the current signal and thus render this signal useless for the purpose intended.

It is a unique feature of this circuit that a linear phase lowpass filter is used to eliminate the harmonics present in the current signal 8 without affecting the signal phase. Specifically, the filter produces negligible phase shift and attenuation over the entire VCO frequency range, but sharp attentuation begins above the upper VCO operating frequency.

Use of a linear phase low pass filter is advantageous not only in case of a square wave driving voltage but in any case in which there is to be expected the occurence of harmonic frequencies of the driving voltage.

The output of the linear phase lowpass filter 10 is a pure sinusoid which is the fundamental component of the current signal 8. All harmonics resulting from the square wave drive voltage are removed. The current signal is amplified by the threshold amplifier 11, and used as one input to a phase detector 13. The threshold amplifier 11 serves two purposes. First, it amplifies the low level signal present at the output 10 of the filter 9, to a suitable level as required by the phase detector 13. With this circuit, it was found convenient to use a type of phase detector that requires a square wave input, so the gain of the amplifier 11 is set to a very high value, and it also acts as a schmidt trigger, producing the required square wave output. The second function of the threshold amplifier 11 is to blcck the passage of very low level current signals to the phase detector 13. When the transducer 5 is driven at its parallel resonance frequency, the current through it is at a minimum. Since voltage and current are also in phase at parallel resonance, the circuit may attempt to lock to the parallel resonance point. Since this circuit is optimized for operation at series resonance, improper operation will occur if this happens. This is prevented, since at parallel resonance, the current level is below the threshold of the amplifier 11, and therefore, the signal will not pass through the threshold amplifier 11 to the phase detector 13, and the circuit will not attempt to lock to the parallel resonance point.

The other input signal to the phase detector 13 is the transducer driving voltage. This may by conveniently taken from the VCO output 2, since there is negligible phase difference between this signal and the high voltage signal at the transducer 5 itself. This voltage signal is phase shifted by $-90°$ in the phase shifter 17, and used as the second input to the phase detector 13.

The phase detector 13 is preferably a multiplying type analog phase detector, or a pseudo-analog phase detector (acting in a way similar to an analog, multi-plying-type detector) such as a digital EXCLUSIVE-OR gate, because these types exhibit high tolerance to electrical noise which will likely be present due to the harmonic content of the output circuit. A multiplying phase detector operates with a nominal 90° phase difference between its inputs when there is zero phase error, therefore the above mentioned $-90°$ phase shifter 17 is used to correct for this.

Alternatively, if a digital sequential phase detector is used, such a phase detector operates with zero phase between its inputs, and therefore the $-90°$ phase must be eliminated. The sequential phase detector, however, is less recommended due to its noise sensivity.

The output of the phase detector 13 is the sum and difference of the two input frequencies. The two input frequencies are, by definition, equal since the transducer current must be the same frequency as the driving voltage, although there may exist a phase difference. Therefore, the difference is zero Hertz and the sum is two times the input frequency. A loop or lowpass filter 15 is used to remove the "sum" frequency, leaving only the "difference" signal which is a DC level, and is used as an input to control the frequency of the VCO 1.

To close the loop, the lowpass filter 15 is connected between the output 14 of the detector 13 and the input 16 of the VCO 1. An integrator, modified to provide loop stability, is used as a filter instead of the more commonly used passive R-C lowpass filter. This filter serves four purposes.

The first purpose is to filter out the "sum" frequency component from the phase detector output so that only a DC control voltage remains for input to the VCO 1.

The second purpose of the lowpass filter 15 is of extreme importance for the operation of this circuit. This purpose is to provide very high DC gain within the loop. It is this high loop gain which allows the circuit to lock to the exact resonance frequency of the transducer 5. If the loop gain was low, the phase relationship of the two inputs of the phase detector 13 would not be a constant 90°. In fact with the common R-C lowpass filter often used as a loop filter, the phase relationship of the two phase detector inputs change from 0° at one extreme of the VCO range, to 180° at the other extreme of the VCO range. There would be a 90° phase offset only at the center of the VCO frequency range. In this case, the transducer 5 would be driven at its resonant frequency only if this was very close to the VCO center frequency. The use of a high DC gain amplifier (in this case, an integrator) placed between the phase detector 13 and the VCO 1, forces a constant 90° phase shift at the phase detector inputs, when the loop is locked, regardless of frequency.

The integrator operates as follows: a voltage at the reference input 15-1 of the operational amplifier 15-6 is set to the same value which will drive the VCO 1 at its center frequency, and that would produce a 90° phase offset at the phase detector inputs. Since, when the loop is locked, the integrator acts as a very high gain DC amplifier, only a very small voltage deviation at the inverting input 15-2, relative to the reference voltage 15-1, is required to cause the output of the integrator 16 to swing from one extreme to the other of the VCO input voltage range. This means that the output 14 of the phase detector 13 is always very close to its mid point and therefore the inputs are always 90° apart; the phase change between the phase detector inputs is reduced by a factor equal to the DC voltage gain of the integrator (which is typically about 100 dB).

The integrating action is produced by the action of the capacitor 15-5; the integrator's linearly decreasing frequency response supplies the desired lowpass filter action. Since the loop is a second order type, the basic integrator is modified with resistors 15-3 and 15-4 to ensure loop stability.

The third purpose of the integrator is to act as part of the frequency sweeping circuit which will be shown later.

The fourth purpose of the integrator is to act as a short term memory of the VCO operating frequency as part of the burst power control circuit as described later.

The circuit, then, forms a second order phase locked loop. The input signal to the loop is the current signal of the transducer 5. The phase detector 13 compares the phase of this current signal with the phase of the VCO output signal (that is, the transducer driving voltage signal), and adjusts the frequency of the VCO 1 until there is zero phase difference between the voltage and current signals. Since operation at parallel resonance is blocked by the threshold amplifier 11, operation at series resonance is the only possibility.

In summary, this basic circuit drives a piezoelectric transducer 5 exactly at its natural series resonance frequency, providing that this resonance frequency lies within the pre-set range of the VCO 1. The circuit follows the changes in resonance frequency that may occur for reasons given earlier. There is no difference in the circuit's ability to accurately lock to the transducer's resonance point, whether this resonance point is at the center of the VCO operating range, or near to its limits; the circuit always drives the transducer 5 so that its voltage and current are in phase.

Modified Circuit Description

The basic method of driving an ultrasonic transducer as shown above, is now developed further to include the following features:

1. A means of automatic power control to compensate for differences in individual transducers and effects caused by transducer ageing and buildup of deposits.
2. A means of reducing the basic power level required to sustain atomization, especially at very low temperatures.
3. A means of frequency sweeping the transducer at high amplitude, to assist in clearing it of excess liquid, and finding the resonance point.
4. A method of recognizing the transducer resonance frequency, as a means of starting and stopping the above frequency sweeping.

Items 1 and 2, above, are both achieved by the same means; that is by pulse width modulating the output driving voltage. While the use of pulse width modulation as a means of power control is well known, it is a unique feature of this circuit that power delivered as a series of short, high amplitude bursts is used as a means of greatly reducing the minimum power level required to sustain atomization. This minimum power level, below which the atomizer floods, can be impractically high especially at very low temperature and when atomizing inferior types of fuel oil. This circuit allows the reduction of this minimum power level, while maintaining good atomization.

Figure 4:
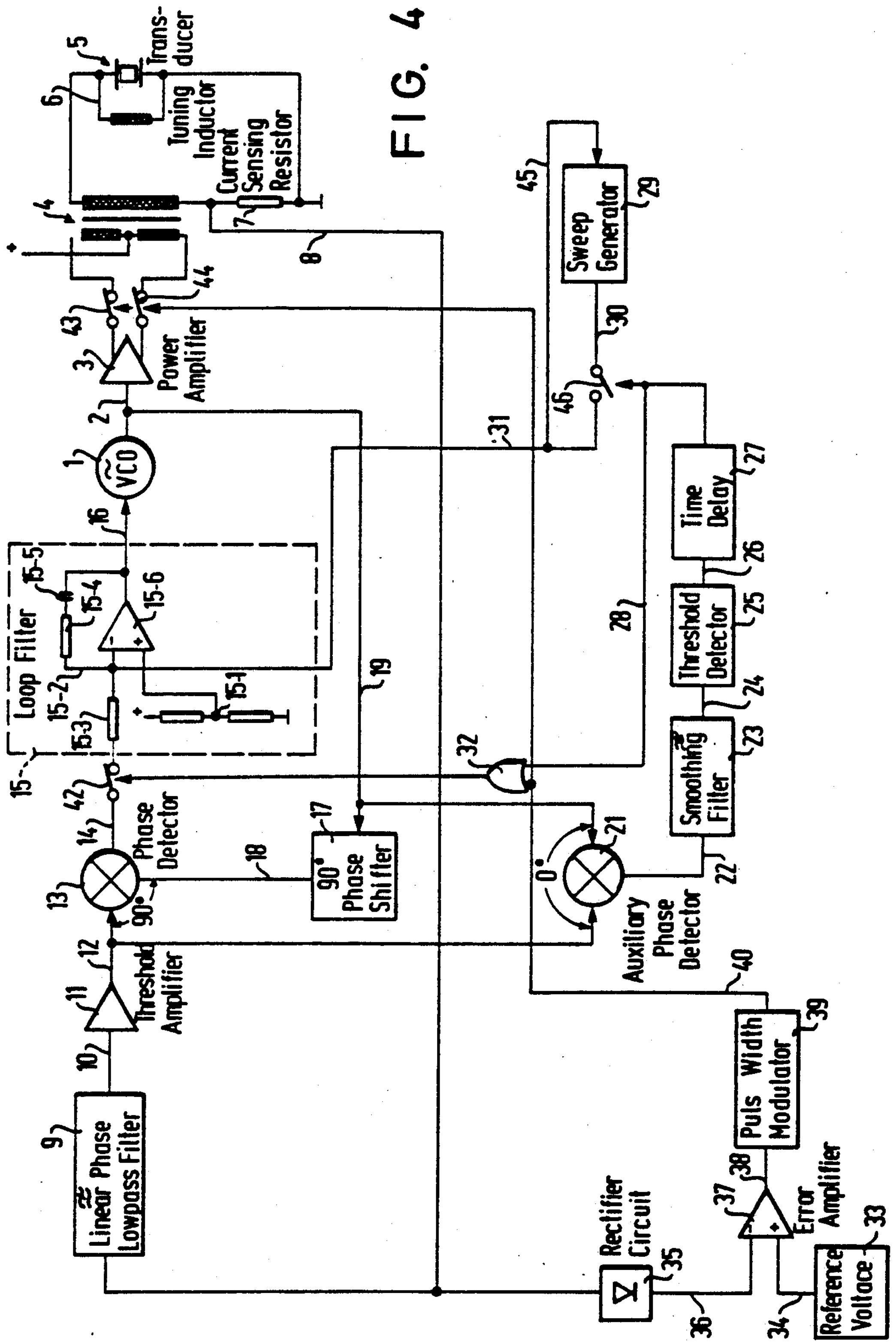
FIG. 4 is the circuit diagram of a second embodiment of the invention.

Referring now to FIG. 4, the pulse width modulation scheme operates as follows: In order to pulse width modulate the basic phase locked loop circuit described above, a means of switching off the output driver circuit is required. Additionally, a means of keeping the VCO 1 "idling" at a frequency close to the transducer's resonance frequency, when the output is in the "off" state is required, to ensure fast loop lockup when the output is switched on again.

The embodiment shown in FIG. 4 includes the basic transducer driving circuit as shown in FIG. 1. In addition to this basic transducer driving circuit, FIG. 4 includes a sweep circuit comprising a sweep generator 29, the input and the output of which are connected to the inverting input of the operational amplifier 15-6, the output of the sweep generator 29 through a switch 46.

Switch 46 is controlled by means of a sweep activating circuit comprising an auxiliary phase detector or comparator 21, one input of which is connected to the output of the threshold amplifier 11 and the other input of which is connected to the output of VCO 1. The output of the auxiliary phase comparator 21 is connected to the input of a smoothing filter 23, the output of which is connected to the input of a threshold detector 25. The output of threshold detector 25 is connected to the input of a resettable time delay circuit 27, the output of which is connected to a control input of switch 46 as well as a first input of an OR gate 32, the output of which is connected to a control input of a switch 42 disposed between the output of the phase comparator 13 and the input of the loop filter and high gain amplifier 15.

An error amplifier 37 is formed by a differential amplifier, an inverting input of which is connected to the current sensing resistor 7 through a rectifier circuit 35 and a non-inverting input of which is connected to a reference voltage source 33. The output signal of the error amplifier 37 controls a pulse width modulator 39, the output of which is connected to a second input of OR gate 32 and control inputs of switches 43 and 44, each coupled between one of the outputs of power amplifier 3 and one end of the primary winding of transformer 4.

The switching of the outputs of the power amplifier 3 is conceptually shown as two switches (43 and 44). In practice this is normally accomplished by switching off the amplifier output transistors. During the "on" period of the output burst, the basic phase locked loop circuit operates exactly as previously described, since switches 42,43 and 44 are closed. When the output burst is switched off, the switches 43 and 44 are opened, cutting off the drive voltage to the transducer 5. The transducer current quickly decays to zero, and the input signal 12 to the phase detector 13 is now absent. This would cause the phase comparator 13 to output an erroneous signal which would start to move the VCO 1 to a new frequency. However, at the point that switches 43 and 44 are opened to cut off the output, switch 42, an electronic analog gate, is also opened to block the erroneous phase detector output. Since the integrator of the low-pass or loop filter 15 now has no input, it acts as a "memory" circuit, automatically holding its last output voltage value. This keeps the VCO 1 operating at a frequency very close to the resonant point of the transducer 5, while the loop is open, so that the locking time of the phase locked loop is reduced at the start of the next burst.

At the start of the next output burst, switches 43 and 44 are closed, supplying driving voltage to the transducer, and switch 42 closes, re-connecting the loop. Transducer current quickly builds up to a normal level, and the loop locks again almost instantly since the VCO 1 was kept at the correct frequency when the loop was open. The on/off ratio at the output is controlled by pulse width modulator 39. A burst period is selected which is short enough to ensure that the transducer 5 does not flood during the "off" period, but long enough to allow the loop to lock during snort burst; a burst period in the range of 10 ms has been found to be optimum.

For a given average power output, a relatively low burst duty cycle with high peak power during the "on" period is used. This results in a reduction in overall power required for atomization as mentioned earlier. This duty cycle is automatically varied as a means of automatic power control. The pulse width modulator 39 which controls the output duty cycle is under the control of a constant current circuit. The transducer current signal at point 8 is passed through the rectifier 35 (or any other circuit producing a DC signal proportional to the transducer current) and the resulting DC level which corresponds to the average transducer current is compared to a reference value in the error amplifier 37. The difference between the measured value of the transducer current and the desired value is shown by the output signal 38 of the error amplifier 37. This error signal causes the pulse width modulator 39 to change the duty cycle of the transducer driving voltage in a direction which reduces the value of the error signal, in an attempt to produce constant transducer current.

Normally in a constant current circuit, the gain of the error amplifier 37 is made to be very high. In a circuit where the output voltage is controlled to cause the output current to be constant, the result is indeed constant output current, but not constant output power; since power is the product of current and voltage, to have constant power with constant current requires the voltage to be constant as well.

With this circuit where power is controlled by maintaining a constant driving voltage and varying the modulation duty cycle, the result is both constant average output current and constant average output power. Here, a basic constant current circuit is used, but with the circuit controlling the duty cycle and not the output voltage. When the effective atomizer resistance increases, the instantaneous output power is decreased proportionally with the decreased instantaneous output current. The circuit reacts by increasing the duty cycle in proportion to the reduced average current, so that the average output current, and therefore the average output power returns to the desired value.

Above item 3, that is a sweep circuit, is achieved as follows: when a signal 28 to start the sweeping action is generated, this signal passes through the gate 32 and causes the electronic switch 42 to open. The input of the integrator of lowpass loop filter 15 is now disconnected. At the same time, the signal 28 closes the electronic switch 46 and the output 30 of the sweep generator 29 is now connected into the input of the integrator.

The output of the sweep generator 29 is constructed as a current source. To start the VCO 1 sweeping with an increasing frequency, a constant, relatively low current is drawn from the integrator input 15-2 into the output of the sweep generator 29. This causes the integrator output to ramp upward in voltage, causing the VCO 1 to sweep with constantly increasing frequency.

When the output of the integrator reaches its upper limit, its input, which was previously held at constant voltage, now starts to decrease in voltage. A comparator within the sweep generator 29 detects the start of this voltage change and causes the current flow at the output of the sweep generator 29 to reverse. The output of the sweep generator 29 now forces a relatively high constant current into the integrator input. The integrator responds by causing its output to ramp rapidly downward in voltage, and the VCO frequency drops rapidly to its lower limit.

When the integrator output reaches its lower voltage limit, the integrator input can no longer be held at a constant voltage, and its voltage now starts to increase. This is again detected by the sweep generator 29, which again reverses the direction of its output current and slow upward frequency sweeping begins again.

The sweep generator, then, consists of a comparator which senses the voltage change that occurs at the integrator input when the integrator output reaches its upper or lower limit. The comparator output alternately switches a current source or a current sink to the input of the integrator, causing it to sweep the VCO to its upper frequency limit, then return to its lower frequency limit and begin a new sweep.

The result is a relatively slow upward frequency sweep, followed by a fast return to low frequency, then the start of a new sweep cycle. The purpose of sweeping in an upward direction is as follows: when a transducer used for atomizing a liquid is flooded, its resonance is very heavily damped. Because of the additional mass of liquid, this damped resonance is at a lower frequency than during normal operation. When sweeping from a lower frequency, this damped resonance is first located. At this point, the excess liquid is first shaken off the transducer, and the resonant point rises to its normal frequency. The sweeping action continues until the correct resonance frequency is found.

If the sweeping action was instead from high to low frequency, the sweep circuit would not be able to follow the increase in resonance frequency as the excess liquid was shaken off the transducer 5.

It should be noted that the sweeping automatically occurs at high amplitude, since the current through the transducer 5 is very low when it is off resonance, and therefore the power regulation circuit reacts by increasing the burst duty cycle to 100%. This also assists in clearing the transducer 5 of excess liquid.

When the approximate resonance frequency is detected, a signal 28 disconnects the sweep generator output 30 at the electronic switch 46, and closes the electronic switch 42 again. The transducer 5 now is free of excess liquid, and normal action of the phase locked loop causes the system to lock to the transducer's resonance frequency.

Above item 4, that is a resonance detector, is accomplished using the auxiliary phase detector 21. This additional phase detector 21 is of the same type as the main phase detector 13, but is connected so that when the loop is locked, it has a 0° phase difference between its inputs. Under this condition, its output is at the extreme lower limit of its range. Any change of phase across its inputs, as caused by the loop starting to go out of lock, causes its output voltage to increase, indicating the start of an "out of lock" condition.

The output 22 of the auxiliary phase detector 21 is fed to the smoothing filter 23 to eliminate any high frequency "sum" component, and the DC level 24 that results is fed to the threshold detector 25. When the loop is locked, the voltage and current signals fed to the auxiliary phase detector 21 are in phase, and therefore the output 22 of the auxiliary phase detector 21, and therefore the output 24 of the filter 23, is a very low DC level. This level is lower than the threshold of the threshold detector 25. When the loop loses lock (for example, the transducer becomes flooded), the voltage and current signals begin to move out of phase. This is detected by the auxiliary phase detector 21, and the voltage at the output 24 of the filter 23 begins to rise. When the voltage at the filter output 24 rises above the threshold of the threshold detector 25, representing a pre-determined phase error of the transducer voltage and current signals, the detector output generates an "out of lock" signal 26.

Because the circuit operates in burst mode, an "out of lock" signal will be generated each time the transducer 5 is switched off during a burst. This is normal, and must not cause the sweep circuit to operate. To ensure the sweep circuit starts only when a true "out of lock"

condition occurs, the "out off lock" signal is delayed by using it to trigger the resettable time delay circuit 27. When it is triggered, the time delay circuit 27 will output a signal to start sweeping, after a short delay equivalent to several burst cycles. However, if the "out of lock" signal from the auxiliary phase detector 21 is of only short duration, that is, less than the delay of the time delay circuit 27, the time delay circuit 27 will immediately reset and the sweep circuit will not operate. If the "out of lock" signal persists for several burst cycles, the time delay circuit 27 will produce an output, and the sweep circuit will start.

In this way, the current and voltage signals are monitored to ensure that they are in phase. If they are not in phase, then after a short delay to ensure that the transducer is not in its "burst-off" state, the sweep generator 29 is started to assist in locating the resonance point again.

While this invention has been described by means of particular embodiments, it will be understood that it is capable of further modifications. This application is therefore intended to cover any variations, uses, or adaptations of the invention following the general principles thereof, and including such departures from the present disclosure as come within known or customary practice in the art to which this invention pertains and fall within the limits of the appended claims.

I claim:

1. A circuit arrangement for driving ultrasonic liquid atomizers, comprising:

an ultrasonic transducer;

oscillator means having an oscillator input coupled for driving said ultrasonic transducer with a transducer driving voltage;

current sensor means coupled for sensing a resulting transducer current and for producing an output signal corresponding to the resulting transducer current;

first controllable switch means having a first switch control input and being coupled between said oscillator means and said ultrasonic transducer, for intermittently connecting said ultrasonic transducer to said oscillator output;

pulse width modulator means coupled between said first switch control input and said current sensor means, for outputting switch control pulses, the duty cycle of which is in response to an actual level of an output signal from said current sensor means such that a width of said switch control pulses is the larger the smaller is the level of said output signal from said current sensor means;

phase comparator means having two comparator inputs and a comparator output, for comparing the phases of said transducer driving voltage and said transducer current;

one of said two comparator inputs being coupled to receive a voltage signal being proportional in phase to said transducer driving voltage, and the other of said two comparator inputs being coupled to receive a current signal from said current sensor means;

an integrating low pass filter means having a filter input and a filter output and being coupled between said comparator output and said oscillator input; and second controllable switch means having a second switch control input and being coupled between the phase comparator output and the filter input;

said second switch control input being coupled to receive said switch control pulses from said pulse width modulator means, for disconnecting said filter input from said comparator output when said first controllable switch means disconnects said ultrasonic transducer from the oscillator output.

2. A circuit arrangement according to claim 1, wherein the first controllable switch means comprises a switchable power amplifier coupled between said oscillator means and said ultrasonic transducer.

3. A circuit arrangement according to claim 2, wherein said oscillator means is a voltage controlled oscillator means.

4. A circuit arrangement according to claim 1, wherein said oscillator means is a voltage controlled oscillator means.

* * * * *